April 26, 1966 M. I. JACOB 3,248,663

HIGH EFFICIENCY LINEAR AMPLIFIER SYSTEM

Filed Feb. 25, 1963 3 Sheets-Sheet 1

WITNESSES

Theodore F. Wrobel

William L. Gates

INVENTOR

Mark I. Jacob

BY Ernest P. Klipfel

ATTORNEY

HIGH EFFICIENCY LINEAR AMPLIFIER SYSTEM

Filed Feb. 25, 1963 3 Sheets-Sheet 2

April 26, 1966 M. I. JACOB 3,248,663

HIGH EFFICIENCY LINEAR AMPLIFIER SYSTEM

Filed Feb. 25, 1963 3 Sheets-Sheet 3

United States Patent Office 3,248,663
Patented Apr. 26, 1966

3,248,663
HIGH EFFICIENCY LINEAR AMPLIFIER SYSTEM

Mark I. Jacob, Ellicott City, Md., assignor to Westinghouse Electric Corporation, Pittsburgh, Pa., a corporation of Pennsylvania Filed Feb. 25, 1963, Ser. No. 260,758
11 Claims. (Cl. 330—124)

This invention relates in general to a system for electric amplification and more particularly to a system for providing linear amplification of electrical signals having amplitude variations at a relatively high over-all operating efficiency.

Briefly, the problem has existed in providing a high efficiency linear amplifier adaptable to utilize high efficiency solid state amplifiers of the type described and claimed in copending applications, Serial No. 256,701, filed February 6, 1963, by Tom L. Dennis and Serial No. 256,693, filed February 6, 1963, by James H. Andreatta, both of which are assigned to the assignee of the present invention. Whereas prior inventions in the field of linear amplification of electrical signals are known to provide adequate results, they have been found to be impractical where high efficiency solid state amplifiers are to be employed. Solid state amplifiers of the type referred to above employ semiconductors operated as switches to alternately charge and discharge a network which provides a low impedance to the frequency to be amplified but a high impedance to all harmonics thereof. Additionally the transistors are driven into switching mode by a driving signal which saturates the semiconductors when conductive only to the point where a minimum saturation internal impedance is provided and this condition is maintained throughout the conductive period without over-driving the semiconductor at any time. Overall operating efficiencies in the order of 90% or greater are achieved with solid state amplifiers of this type. It is desirous to utilize amplifiers covered by the aforementioned inventions in providing a high efficiency linear solid state amplifier for the amplification of radio frequency signals in apparatus such as a radio transmitter.

It is an object of the present invention therefore, to provide a high efficiency linear amplifier for electrical signals.

It is another object of the present invention to provide an amplifier system for the amplification of radio frequency signals having amplitude variations in a linear amplifier adapted to utilize high efficiency solid state amplifier units.

It is a further object of the present invention for providing a linear amplifier system for radio frequency signals wherein high efficiency linear amplification is provided with the use of solid state active elements.

Briefly, the present invention accomplishes the above-cited objects by converting an input signal having amplitude variations into two or more signals which are shifted in phase with respect to each other and where at least one of the signals has a variable phase shift which is a function of the amplitude variations of the input signal. These phase shifted signals are then amplified in high efficiency amplifiers and then reconverted in an isolating adder network which transforms the phase variations into an output signal having amplitude variations. Stated in another way, the invention converts signals varying in amplitude into signals which vary in phase. These signals are then amplified in constant level amplifiers utilizing solid state active elements and then a reconversion is effected to change the phase varying constant amplitude amplified signals back into an output signal which reproduces the input signal having amplitude variations in amplified form.

Further objects and advantages of the invention will become apparent as the following description proceeds.

For a better understanding of the invention, reference may be had to the accompanying drawings in which.

Figures 1, 2:
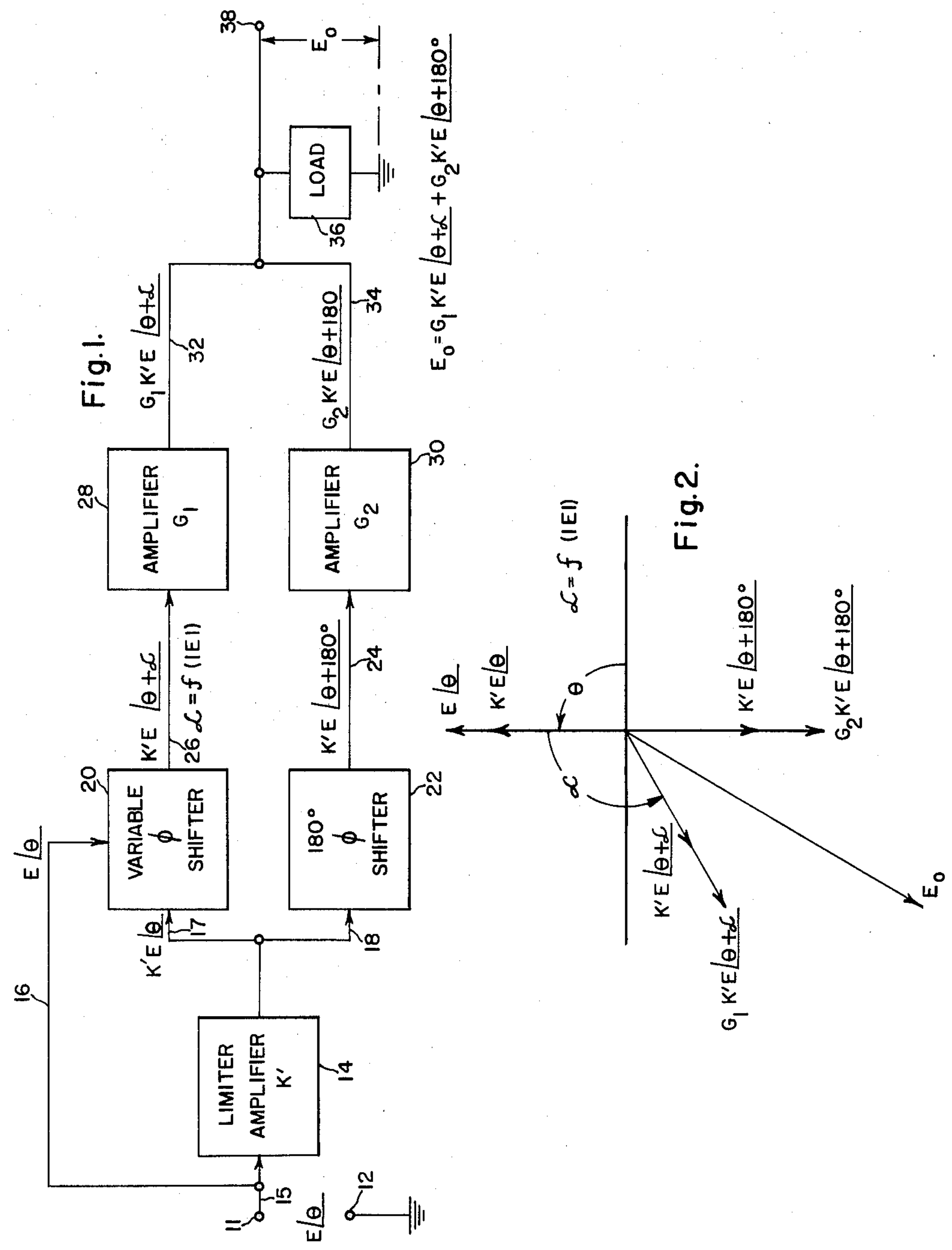
FIGURE 1 is a block diagrammatic illustration of one embodiment of the present invention.
FIG. 2 is a diagram more fully illustrating the embodiment of FIG. 1.

Referring now to FIG. 1, the first embodiment of the present invention comprises a limiter amplifier 14, a variable phase shifter 20, a first amplifier 28, a 180° phase shifter 22, a second amplifier 30 and a load 36, all interconnected as hereinafter described. A pair of input terminals 11 and 12 are included for the application of an input signal. Terminal 11 is connected to the limiter amplifier 14 by suitable circuit means 15. Terminal 12 is returned to a point of common reference potential illustrated as ground. The limiter amplifier 14 is coupled to the variable phase shifter 20 and the 180° phase shifter 22 by means of suitable electrical circuit means 17 and 18, respectively. In addition to the connection 17, the variable phase shifter is also coupled to the input terminal 11 by means of a suitable circuit connection 16.

The variable phase shifter 20 comprises an electrical circuit which will shift the phase of a signal applied thereto in accordance with a control signal which is dependent on the amplitude variation of the input signal applied to input terminals 11 and 12. The variable phase shifter 20 then, is a voltage variable phase shifter and can be of any type which are known to those skilled in the art; however, one means for providing a variable-phase shift will be more fully illustrated in connection with the embodiment shown in FIG. 5 which will be more fully explained subsequently.

The variable phase shifter 20 is coupled to the first amplifier 28 by electrical circuit means 26 and electrical circuit means 24 connects the 180° phase shifter 22 to the second amplifier 30. Outputs from the first and second amplifiers 28 and 30 are coupled to the load 36 by means of electrical circuit means 32 and 34 respectively.

The first and second amplifiers 28 and 30 are of the constant level type in that the gain of these amplifiers is substantially constant and mutually equal. Additionally, amplifiers 28 and 30 are preferably high efficiency solid state amplifiers of the type previously mentioned with respect to the inventions disclosed in Serial Nos. 256,701 and 256,693, previously noted.

The operation of the embodiment shown in FIG. 1 will now be explained. Reference to FIG. 2 will aid in the explanation since FIG. 2 is a vector diagram of the magnitude and phase relationship of signals appearing at various points in the amplifier system disclosed. In this embodiment, an input signal $E\angle\theta$ having amplitude variations is applied to the input terminals 11 and 12. The input signal is applied to the limiter amplifier 14 which produces a constant level signal $K'E\angle\theta$ irrespective of the amplitude of the input signal $E\angle\theta$. The limited signal $K'E\angle\theta$ is simultaneously applied to the variable phase shifter 20 and the 180° phase shifter 22 by means of the electrical circuit means 17 and 18. At this juncture, two separate channels are developed, one of which is comprised of the variable phase shifter 20 in combination with the first amplifier 28 and the other of which is comprised of the 180° phase shifter 22 in combination with the second amplifier 30. The variable phase shifter 20 receives the constant level signal $K'E\angle\theta$ simultaneously with the input signal $E\angle\theta$ and shifts the phase angle of the constant level signal $K'E\angle\theta$ to generate a constant level signal shifted in phase where the phase is proportional to the amplitude of the input signal $E\angle\theta$. The variable phase shifter then provides a signal $K'E\underline{/\theta+\alpha}$ where $\alpha=f(|E|)$, and $|E|$ is equal to the scalar magnitude of the input signal $E\angle\theta$. This constant level variable phase signal is then amplified in the constant level high efficiency amplifier 28 by a factor of $G_1$ to provide a signal $G_1K'E\underline{/\theta+\alpha}$.

The constant level signal $K'E\angle\theta$ produced by the limiter and applied to the 180° phase shifter 22 produces a signal $K'E\underline{/\theta+180}$. This signal is applied to the second amplifier 30 by means of electrical circuit means 24 and is amplified by a gain factor $G_2$ to produce a signal $G_2K'E\underline{/\theta+180}$.

The signals, $G_1K'E\underline{/\theta+\alpha}$ and $G_2K'E\underline{/\theta+180}$, from the amplifiers 28 and 30 respectively are fed to a load 36 which sums these signals and produces an output signal $E_0$ which reproduces the amplitude variations of the input signal $E\angle\theta$ in amplified form and is the resultant vector quantity of the signals from amplifiers 28 and 30 respectively, according to the equation $$E_0=G_1K'E\underline{/\theta+\alpha}+G_2K'E\underline{/\theta+180}$$

Since the phase angle $(\theta+\alpha)$ of the signal from amplifier 28 is variable in proportion to the amplitude of the input signal $E\angle\theta$, the amplitude sum of the two signals from the constant level high efficiency amplifiers 28 and 30 will vary in proportion to the amplitude of the input signal.

Figure 3:
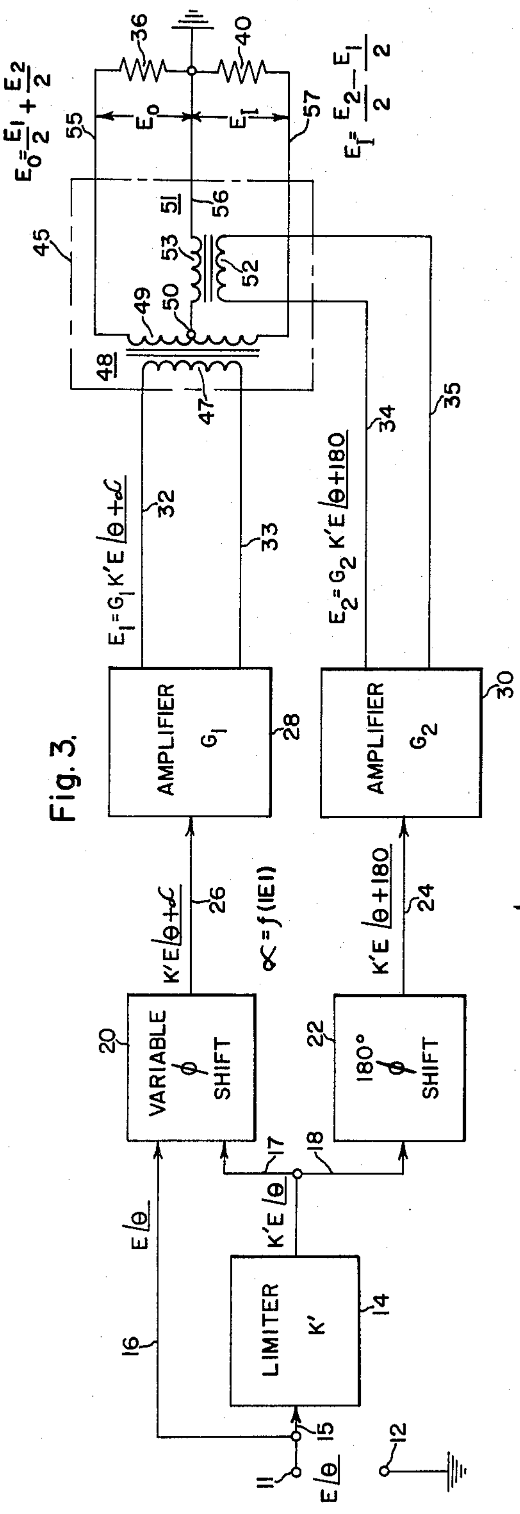
FIG. 3 is a block diagrammatic illustration of another embodiment of the present invention.

Whereas the embodiment disclosed in FIG. 1 results in high efficiency linear amplification, a more practical embodiment is illustrated in FIG. 3 which is similar to the embodiment of FIG. 1 up to the outputs of the amplifiers 28 and 30. In the present embodiment, additional means is included for combining the outputs from high efficiency amplifiers 28 and 30. A combiner or summing network 45 is illustrated which comprises a transformer 48 connected to transformer 51 such that the voltages induced in the secondaries 49 and 53 of transformers 48 and 51, respectively, do not appear in the respective primaries 47 and 52 of the other. More specifically the end terminals to the primary winding 47 of transformer 48 is coupled to the first amplifier 28 by means of suitable circuit means 32 and 33. The secondary winding 49 of transformer 48 is coupled to a load 36 and an isolation means 40 such that one end terminal of secondary winding 49 is connected by electrical circuit means 55 to one end of the load 36 while the opposite end terminal of secondary winding 49 is connected to one end of the isolation means 40 by electrical circuit means 57. The respective opposite ends of the load 36 and the isolation means 40 are connected together and returned to ground potential. The other transformer 51 of the combiner network 45 has its primary winding 52 coupled to the second high efficiency amplifier 30 by means of suitable electrical circuit means 34 and 35. The secondary winding 53 has, for example, half the number of turns as its primary winding and has one terminal connected to the center tap 50 of the secondary winding 49 while the opposite terminal is returned to ground by means of electrical circuit means 56. The interconnection of transformers 48 and 51 prevents interaction between the amplifiers 28 and 30 and thereby provides a constant load impedance under substantially all operating conditions. This network describes what is referred to in the art as a hybrid circuit. The term, hybrid, is a term used to define a passive isolation network which provides a plurality of outputs from one or more non-interacting inputs. The term, hybrid, is used in connection with distribution of power to an output load such as a radio antenna from an output power amplifier.

Accordingly the load 36 may be the load impedance as presented by a radiating antenna for a radio transmitter. The combiner unit 45 is untuned and, therefore, requires no adjustment with variations in signal frequencies within wide limits.

In operation, the embodiment of FIG. 3 operates in the substantially identical manner as the embodiment shown in FIG. 1 up to the combiner 45. Designating the signal from the high efficiency amplifier 28 $E_1$ and the signal from the high efficiency amplifier 30 $E_2$ where $$E_1=G_1K'E\underline{/\theta+\alpha}$$

and $$E_2=G_2K'E\underline{/\theta+180}$$

Figure 4:
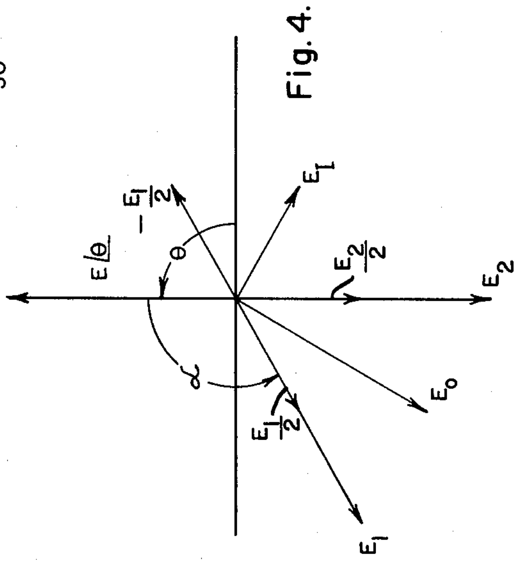
FIG. 4 is a diagram more fully illustrating the embodiment of FIG. 3.

$E_1$ and $E_2$ are impressed across the primary windings 47 and 52 of transformers 48 and 51 respectively, and referring to FIG. 4, which illustrates the vector relationship of the voltages concerned with the combiner network 45, the combiner acts to vectorially add and subtract voltages appearing across the secondary windings 49 and 53. Therefore, ½ of the signal $E_1$ is vectorially added to ½ of the signal $E_2$ to provide an output signal $E_0$ such that $$E_0=\frac{E_1}{2}+\frac{E_2}{2}$$

On the other half winding of secondary winding 49, ½ of the voltage of the signal $E_1$ is subtracted from ½ of the signal $E_2$ appearing across secondary winding 53 to provide a signal $E_I$ across the isolator means 40 according to the relationship $$E_I=\frac{E_2}{2}-\frac{E_1}{2}$$

Referring to FIG. 4, the vector $E_1$ is a voltage whose phase angle is varying in accordance with the amplitude variations of the input signal $E\angle\theta$, or $|E|$. Therefore, the vector $E_1$ will be of constant magnitude with a changing phase angle of $\underline{/\theta+\alpha}$. The vector $E_2$ is of a constant amplified magnitude shifted 180° from the input signal $E\angle\theta$. Summing the vectors $E_{1/2}$ and $E_{2/2}$ provides the output vector $E_0$ which varies in amplitude according to the amplitude variations of the input signal $E\angle\theta$ and reproduces the input signal in amplified form. The vector $E_I$ is much less in magnitude than the vector $E_0$ since it is the resultant vector of subtracting the vector $E_{1/2}$ from $E_{2/2}$.

Figure 5:
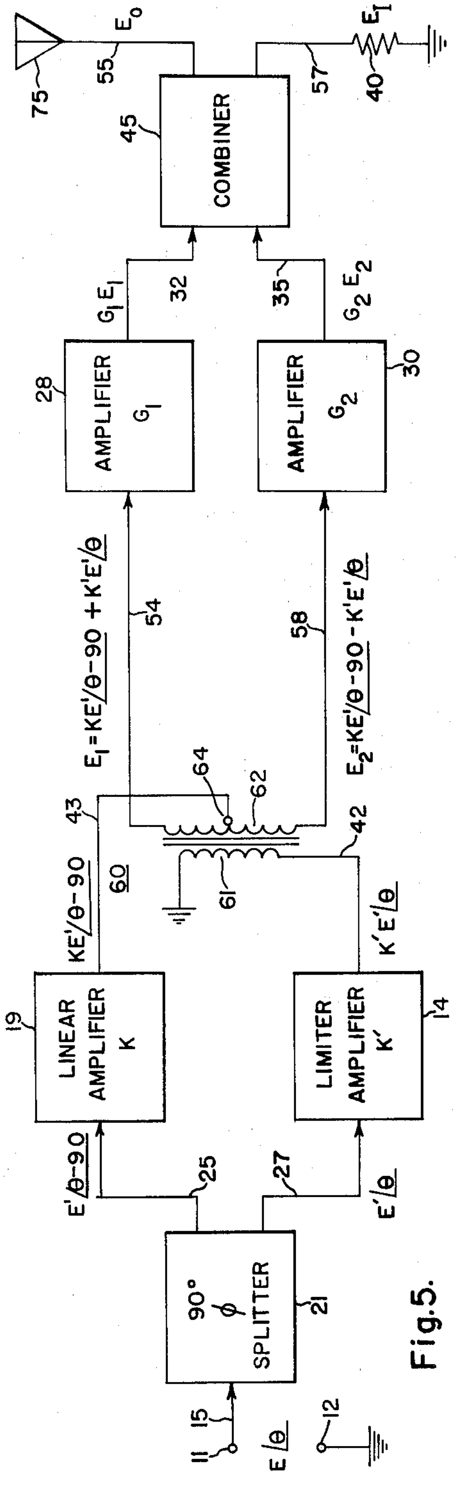
FIG. 5 is a diagrammatic illustration of yet another embodiment of the present invention.

The third and most preferred embodiment of the present invention is illustrated in FIG. 5. Although the basic concept of changing the input signal having amplitude variations into a signal which is changing in phase with respect to the amplitude variations of the input signal and then reconverting the phase variations back into amplitude variations remain the same, however, the manner in which the phase shift of the signal is effected is modified.

Referring to FIG. 5 the input signal $E\angle\theta$ is applied to input terminals 11 and 12 where terminal 12 is coupled by means of electrical circuit means to a 90° phase splitter 21 which separates the input signal into two component signals separated by a phase angle difference of 90°. The 90° phase splitter 21 may be of any well known phase shift network which is capable of providing the desired phase shift. The two components of the input signal can be designated $E'\underline{/\theta-90}$ and $E'\angle\theta$. The 90° phase splitter 21 is similarly connected to a linear amplifier 19 and a limiter amplifier 14 to form two signal channels wherein the first signal $E'\underline{/\theta-90}$ is applied to linear amplifier 19 through circuit means 25 while the second signal $E'\angle\theta$ is applied to the limiter amplifier 14 through circuit means 27. The limiter amplifier 14 is connected to one terminal of primary winding 61 by circuit means 42 while the other terminal of primary winding 61 is returned to ground. The linear amplifier 19 is connected by suitable circuit means 43 to the center tap 64 of the secondary winding 62 of transformer 60. One end terminal of the secondary winding 62 is coupled to a first amplifier 28 by circuit means 54 while the other end terminal of secondary winding 62 is coupled to a second amplifier 30 through the circuit means 58. The amplifiers 28 and 30 are coupled to the combiner network 45 by means of electrical circuit means 32 and 35 respectively, and lastly, the combiner is connected to a radiating antenna 75 by means of circuit means 55 and also to the isolator means 40 through circuit means 57.

Figure 6:
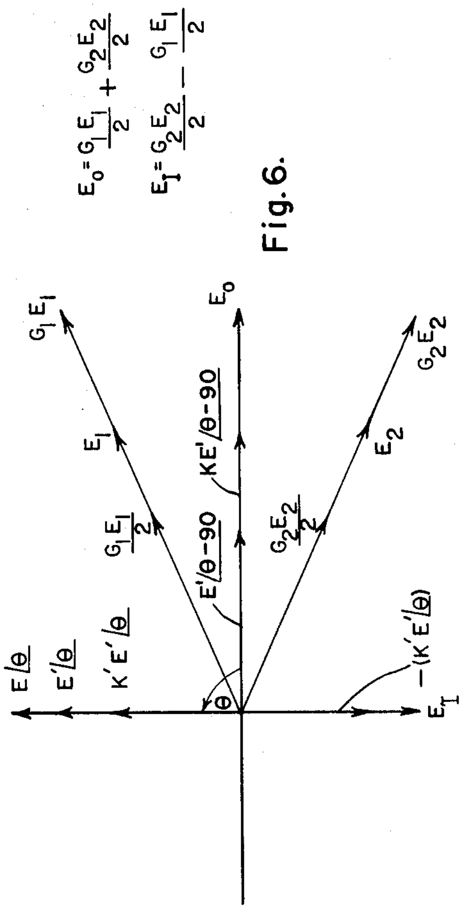
FIG. 6 is a diagram more fully illustrating the embodiment of FIG. 5.

With additional reference to FIG. 6 which illustrates vector representation of the voltage signals at selected points in the system, the two channel signals $E'\angle\theta-90$ and $E'\angle\theta$ are fed to the linear amplifier 19 and the limiter amplifier 14, respectively. The linear amplifier 19 produces a signal which varies linearly with respect to the amplitude of the input signal impressed across the input terminals 11 and 12. Therefore, the signal coming from the linear amplifier 19 will have an amplification factor of K such that the signal coming from linear amplifier 19 can be represented as $KE'\angle\theta-90$. It should be noted that the signal coming from the linear amplifier 19 has the same phase angle as the first signal applied to the amplifier, that is, $\theta-90°$.

The second signal $E'\angle\theta$ is fed to the limiter amplifier 14 and a signal is produced therein which has a constant amplitude $K'E'$ regardless of the amplitude of the input signal and has the same phase as the signal fed to it, namely $\theta$. The signal coming out of the limiter amplifier 14 can be designated as $K'E'\angle\theta$.

The two signals $K'E'\angle\theta$ and $KE'\angle\theta-90$ are coupled to the transformer 60 such that the signal from the limiter amplifier 14 ($K'E'\angle\theta$) is impressed across the primary winding 61 of the transformer 60 whereas the signal from the linear amplifier 19 ($KE'\angle\theta-90$) is fed to the center tap 64 of the secondary winding 62 of transformer 60. The transformer 60 acts to provide signals at the end terminals of the secondary winding 62 that are the sum and difference of the voltages applied across the primary and the center tap 64. One end terminal of the secondary winding 62 provides a first intermediate signal $E_1$ to circuit means 54 which is the vector summation of $KE'\angle\theta-90$ and $K'E'\angle\theta$ such that $$E_1=KE'\angle\theta-90+K'E'\angle\theta$$

The other end terminal of the secondary winding provides a second intermediate signal $E_2$ to the circuit means 58 which is equal to the difference between $KE'\angle\theta-90$ and $K'E'\angle\theta$ such that $$E_2=KE'\angle\theta-90-K'E'\angle\theta$$

The intermediate signals $E_1$ and $E_2$ are both varying in phase with respect to the input signal $E\angle\theta$ due to the fact that the signal from the linear amplifier 19 $KE'\angle\theta-90$ is varying in amplitude proportional to the input signal. The signal $E_1$ is fed to a first constant gain amplifier 28 which, for example, is comprised of a high efficiency linear amplifier utilizing solid state active elements. The output of the constant gain amplifier amplifies the first intermediate signal $E_1$ by a factor of $G_1$ such that the signal fed to the combiner 45 can be designated as $G_1E_1$. Likewise, the second intermediate signal $E_2$ is fed to a second constant gain amplifier 30 having a gain substantially equal to the gain of the first amplifier 28. Likewise, amplifier 30 is, for example comprised of a high efficiency linear amplifier utilizing solid state active elements. The signal from the amplifier 30 has an amplification factor of $G_2$ and, accordingly, the signal fed to the combiner 45 from the amplifier 30 is designated $G_2E_2$.

The combiner 45 acts similarly to the combiner network 45 described with reference to the embodiment shown in FIG. 3, such that the output signal $E_o$ sums the two intermediate signals such that $$E_o=\frac{G_1E_1}{2}+\frac{G_2E_2}{2}$$

and the output signal $E_I$ fed to the isolator means 40 is the difference voltage such that $$E_I=\frac{G_2E_2}{2}-\frac{G_1E_1}{2}$$

By way of example it should be pointed out with respect to the embodiment of FIG. 5 that the over-all operating efficiency of said apparatus which has been built and tested is in the order of 90% at full output power and secondly, the linearity provided is in the order of −40 db third order distortion capability. The isolation of power dissipated into a lumped load allows a choice as to the location of high temperature heat sinks. Since the combiner unit is untuned, and therefore requires no adjustment, the subject invention is capable of operating over wide limits of signal frequencies.

What has been described, therefore, is an amplifying system which takes a signal varying in amplitude and changes it into one or more constant amplitude phase varying signals which are subsequently amplified in constant level high efficiency amplifiers and then are reconverted into an output signal which is varying in amplitude by means of an untuned, isolating combiner network.

Whereas the apparatus has been shown and described with respect to preferred embodiments thereof which gives satisfactory results it should be understood that changes may be made and equivalents substituted without departing from the spirit and scope of the invention.

What I claim is:

1. An electrical signal amplifying system having input and output terminals comprising in combination: circuit means operably connected to said input terminals for converting amplitude variations in a signal applied to said input terminals into a plurality of signals, said plurality of signals including one signal which varies in phase as a function of said amplitude variations; amplifier means operably connected to said circuit means for individually and separately amplifying each of said plurality of signals; an isolating combiner means coupled to said amplifier means for combining said plurality of signals amplified into an output signal which varies in amplitude according to said signals applied to said input terminals.

2. An electrical signal amplifying system having input and output terminals comprising in combination: means operably connected to said input terminals for converting amplitude variations of electrical signals applied to said input terminals into a plurality of signals one of which has phase variations which are proportional to said amplitude variations; amplifier means coupled to said means for converting for individually and separately amplifying each of said plurality of signals, and isolating combiner means coupled to said amplifier means for reconverting signals amplified therein into at least one output signal varying in amplitude according to said signals applied to said input terminals.

3. An amplifying system comprising in combination: input means; circuit means responsive to an input signal applied to said input means for providing a first and a second signal having a predetermined phase relationship with said input signal and wherein at least one of said first and second signal varies in phase in a manner functionally related to the amplitude of said input signal; first amplifier means coupled to said circuit means for amplifying said first signal; second amplifer means coupled to said circuit means for amplifying said second signal; and non-interacting load means including a combiner network coupled to said first and second second amplifiers for summing signals in said first and second signal channels to provide a resultant output signal which is varying in amplitude.

4. An amplifying system having input and output terminals and comprising in combination: limiter means connected to said input terminals for providing a constant amplitude signal irrespective of amplitude variations of signals applied to said input terminals; first phase shift means connected to said limiter means for receiving said constant amplitude signals and including means to receive signals applied to said input terminals to shift the phase of said constant amplitude signals proportionally to the amplitude variations of said signals applied to said input terminals; first amplifier means coupled to said first phase shift means for amplifying said signals having phase variations; second phase shift means coupled to said limiter means for effecting a predetermined phase shift of said constant amplitude signals; second amplifier means coupled to said second phase shift means; and means coupled to said first and second amplifier means being responsive to signals amplified thereby to provide an output signal to a load which is the vector sum of signals from said first and second amplifier means.

5. An electrical amplifying system for an input signal comprising in combination: input and output terminals; circuit means connected to said input terminals for limiting the amplitude of said input signal to substantially a constant magnitude to form a limited signal; first phase shift means connected to said circuit means for varying the phase of said limited signal according to variations in amplitude of said input signal; a first amplifier means connected to said first phase shift means for amplifying by a predetermined gain factor said limited signal shifted in phase; second phase shift means connected to said circuit means, for providing substantially a 180° fixed phase shift to said limited signal; second amplifier means connected to said second phase shift means and having a gain factor substantially equal to said gain factor of said first amplifier means; and means operably connected to said first and said second amplifier means for adding signals amplified therein in vector relationship to produce an output signal to said output terminals which is varying in amplitude according to the amplitude variations of said input signal.

6. An amplifying system for radio frequency signals comprising in combination: means responsive to an amplitude varying input signal for providing at least two signals which are changed in phase with respect to the phase of said input signal, at least one signal having a variable phase shift which is proportional to the amplitude variations of said input signal; means for amplifying said provided signals; and an output circuit connected to perform a vector summation of all the respective amplified signals for producing an output signal which reproduces said input signal in amplified form.

7. An amplifying system for a radio frequency input signal comprising in combination: circuit means for converting said input signal into two intermediate signals having a predetermined phase relationship with the amplitude of said input signal; first and second constant gain means for amplifying each of said intermediate signals; means for combining the amplified signals from said first and second amplifier means; and load means operably connected to said combining means for providing an output signal in accordance with the summation of signals thereby providing an output signal to reproduce said input signal in amplified form.

8. A radio frequency amplifier circuit for an amplitude varying input signal comprising: input terminals and output terminals; electrical circuit means operably connected to said input terminals for converting said input signal into at least two intermediate signals shifted in phase with respect to said input signal including means for varying the phase of at least one of said intermediate signals proportionately to the amplitude of said input signal; amplifier means coupled to said circuit means for amplifying each of said intermediate signals to predetermined levels; and isolating combiner means coupled to said amplifier means for summing said intermediate signals to produce an output signal which reproduces said input signal in amplified form.

9. An amplifier system comprising: phase splitter means responsive to an amplitude varying input signal for producing two quadrature signal components of said input signal; first amplifier means connected to said phase splitter means for amplifying one of said signal components in substantially linear relationship with respect to the amplitude of said input signal; second amplifier means connected to said phase splitter means for limiting the other quadrature signal component to a substantially predetermined constant level; adder means connected to said first and said second amplifier for providing first and second signals produced as a result of a vector summation of said two quadrature signal components amplified by said first and said second amplifiers; a third amplifier connected to said adder means for amplifying said first signal; a fourth amplifier connected to said adder means for amplifying said second signal; and an untuned, isolating combiner network connected to said third and fourth amplifier for reproducing said input signal in amplified form by vectorially combining said first and second signals into an output signal.

10. A radio frequency amplifier system comprising in combination: input means for receiving an input signal having amplitude variations; circuit means for producing two components of said input signal which are related in phase relationship such that said components are separated by a fixed phase difference; a linear amplifier coupled to said circuit means for producing a signal varying in amplitude as a function of the amplitude variations of said input signal; limiter amplifier means coupled to said circuit means to receive the other of said two components for providing a signal having a substantially constant amplitude with respect to amplitude variations of said input signal; first combiner means for producing two signals varying in phase relationship as a function of the amplitude variations of said input signal as a result of a vector combining of said signal varying in amplitude from said linear amplifier and said signal having a substantially constant amplitude from said limiter amplifier; high efficiency amplifier means coupled to said first combiner means for amplifying said two signals produced thereby; and second combiner means for vectorially summing said two signals varying in phase and amplified in said high efficiency amplifier means to provide an output signal which reproduces the input signal in amplified form as a result of the summation of the phase varying components which are related to the amplitude variations of said input signal.

11. The amplifier system of claim 10, wherein said second combiner means includes transformer means interconnected to provide a hybrid circuit of substantially constant load impedance to said high efficiency amplifier means.

References Cited by the Examiner

UNITED STATES PATENTS

| | | | |
|---|---|---|---|
| 2,210,028 | 8/1940 | Doherty | 330—124 X |
| 2,548,855 | 4/1951 | Bartelink | 330—124 X |
| 2,703,380 | 3/1955 | Fraser | 328—133 X |
| 2,751,555 | 6/1956 | Kirkpatrick | 328—134 X |
| 2,763,830 | 9/1956 | Pihl | 328—155 X |
| 2,774,038 | 12/1956 | Stavis | 328—133 |
| 3,092,736 | 6/1963 | Ernyei | 328—133 X |

ROY LAKE, *Primary Examiner.*

R. P. KANANEN, *Assistant Examiner.*